(12) United States Patent
Imai et al.

(10) Patent No.: US 7,642,704 B2
(45) Date of Patent: Jan. 5, 2010

(54) LIGHT-EMITTING DIODE WITH A BASE

(75) Inventors: Sadato Imai, Hachioji (JP); Satoru Kikuchi, Akiruno (JP)

(73) Assignee: Citizen Electronics Co., Ltd., Yamanashi (JP)

( * ) Notice: Subject to any disclaimer, the term of this patent is extended or adjusted under 35 U.S.C. 154(b) by 447 days.

(21) Appl. No.: 11/157,171

(22) Filed: Jun. 21, 2005

(65) Prior Publication Data

US 2006/0001361 A1 Jan. 5, 2006

(30) Foreign Application Priority Data

Jun. 21, 2004 (JP) ............................ P2004-182403

(51) Int. Cl.
*H01J 1/62* (2006.01)
*H01J 63/04* (2006.01)
(52) U.S. Cl. .................. 313/483; 313/498; 313/500; 313/501; 313/506; 313/502; 257/79; 257/81
(58) Field of Classification Search ................. None
See application file for complete search history.

(56) References Cited

U.S. PATENT DOCUMENTS

| | | | |
|---|---|---|---|
| 6,599,768 B1 * | 7/2003 | Chen ........................... 438/22 |
| 6,611,000 B2 * | 8/2003 | Tamura et al. ................. 257/80 |
| 6,642,547 B2 * | 11/2003 | Matsubara et al. ............ 257/98 |
| 7,078,728 B2 * | 7/2006 | Ishii et al. ..................... 257/79 |
| 7,271,423 B2 * | 9/2007 | Hanamoto et al. ............ 257/98 |
| 7,425,729 B2 * | 9/2008 | Yun et al. ..................... 257/98 |
| 2008/0054288 A1 * | 3/2008 | Harrah et al. ................. 257/99 |

FOREIGN PATENT DOCUMENTS

| | | |
|---|---|---|
| CN | 2413390 Y | 1/2001 |
| JP | 11-307820 | 11/1999 |
| JP | 2002-252373 | 9/2002 |
| WO | WO 2004/044877 A2 | 5/2004 |

* cited by examiner

*Primary Examiner*—Nimeshkumar D. Patel
*Assistant Examiner*—Natalie K Walford
(74) *Attorney, Agent, or Firm*—Browdy and Neimark, PLLC

(57) ABSTRACT

The LED comprises: a base having high thermal conductivity and having a mounting surface for die bonding; a printed circuit board mounted on the base and having a hole to expose a part of the mounting surface of the base and having a protruding portion projecting horizontally outward on the outer periphery of the base; an LED element mounted on the mounting surface of the base exposed in the hole of the printed circuit board; and a resin material sealing the LED element from above; wherein through-holes electrically connected to the LED element are formed at the outer periphery of the protruding portion and an external connection electrode is provided to the upper and lower surfaces of the through-holes.

This LED enhances the heat dissipating effect to enable generation of high-luminance light and can also be mounted on either the upper or lower surface of a motherboard.

10 Claims, 5 Drawing Sheets

LIGHT-EMITTING DIODE WITH A BASE

CROSS-REFERENCE TO THE RELATED APPLICATION

The application claims the priority benefit of Japanese Patent Application No. 2004-182403 filed on Jun. 21, 2004, the entire descriptions of which are incorporated herein by reference.

BACKGROUND OF THE INVENTION

1. Field of the Invention

The present invention relates to a high-luminance type light-emitting diode (LED) with a heat dissipation function.

2. Related Art Statement

Light-emitting diodes (LEDs) that have been used as a backlight source for the liquid crystal panels of cell phones and other devices are characteristically small in size with a long life as a light source. In recent years, various types of LEDs have been commercialized, including one that emits colored light and one with high output that illuminates a relatively wide area at high brightness. These colored light illuminating LEDs and high output type LEDs consume a large amount of electricity and therefore heat dissipation becomes an important issue.

Generally, LEDs have an almost proportional relation between the driving current and the brightness of emitted light within a predetermined operational range. Thus, to produce a high level of brightness requires only an increase in the driving current. However, increasing the driving current results in a proportionally larger power loss in the LED element. Most of this power loss is transformed into thermal energy, which in turn increases the temperature of the LED element itself. Since the LED element has the characteristic that its light emission efficiency (current-light conversion efficiency) increases as the temperature lowers, the problem arises that the brightness of light to be produced decreases as the temperature inside the LED element increases. The service life of the LED also becomes shorter as the temperature of the LED element increases. Another problem is that heat-induced discoloration of the light-transmitting resin material sealing the LED element degrades its transparency. These problems have made it difficult to realize the commercialization of LEDs that meet both the requirements of high output and high reliability such as longevity.

To solve these problems, it is essential to provide a means of heat dissipation for LED elements. There are some proposals for such heat dissipation. One such example is the LED shown in FIG. 8 (Japanese Patent Disclosure No. 11-307820). This LED 1 comprises a pair of conductive members 2a, 2b with heat conductivity, an insulating member 3 secured to and electrically separating the conductive members 2a, 2b from each other, an LED element 4 mounted on the conductive members 2a, 2b inside the insulating member 3 at a recessed portion 3a where the conductive members 2a and 2b are exposed, and a light-transmitting seal member 5 sealing the LED element 4. The LED element 4 is mounted straddling the paired conductive members 2a, 2b exposed inside the recessed portion 3a, with the conductive members 2a, 2b soldered respectively at one end to electrode patterns 6a, 6b formed on a printed circuit board 7 such as a mother board.

Japanese Patent Disclosure No. 2002-252373 discloses an LED that employs another means of heat dissipation. In this LED, a substrate on which the LED element is mounted and a lead frame serving as terminal electrodes are formed from the same material, and the substrate situated at almost the same level as the bottom surface of the lead frame is directly mounted on a printed circuit board of an electronic device for example, when the LED is used in an electronic device.

However, in the LED 1 shown in FIG. 8, since heat generated by the LED element 4 is dissipated through the pair of conductive members 2a, 2b and the electrode patterns 6a, 6b to the printed circuit board 7, the heat dissipating performance depends on the heat conductivity of the printed circuit board 7. For example, when a metal core substrate with an excellent heat conductivity is used for the printed circuit board 7, a good heat dissipating performance can be expected, whereas the use of an ordinary printed circuit board made of a low-cost material such as glass epoxy cannot be expected to produce a significant heat dissipating effect. This is because the heat conductivity of glass epoxy materials is a few hundred times smaller than that of metal materials such as copper alloy and the resulting large thermal resistance prevents the heat from being released efficiently. Thus, to realize an efficient heat dissipation, it is essential that a metal core substrate is used for the printed circuit board 7. The metal core substrate, however, has the problems of increased cost and that the metal core substrate is difficult to wire on both sides for high density integration. Further, since the metal core substrate is a conductive material, it must be insulated by covering its surface with an insulating layer, which in turn degrades the heat conduction and therefore the heat dissipation effect.

The LED disclosed in Japanese Patent Disclosure No. 2002-252373 also has a similar problem. That is, since the substrate is mounted in intimate contact with the printed circuit board, the heat conduction from the substrate to the printed circuit board is relatively good. But when the printed circuit board is made of glass epoxy, its low heat conductivity worsens the heat dissipating performance.

SUMMARY OF THE INVENTION

The object of the present invention is to provide a high-luminance type LED which minimizes power loss in the form of heat and enables generation of bright light, and also, which can be mounted by using either of the upper and lower surfaces of the LED's printed circuit board.

Viewed from one aspect, the present invention provides an LED comprising: a base having high thermal conductivity and having a mounting surface for die bonding; a printed circuit board mounted on the base and having a hole to expose a part of the mounting surface of the base and having a protruding portion projecting horizontally outward on the outer periphery of the base; at least one LED element mounted on the mounting surface of the base exposed in the hole of the circuit board; and a light transmitting resin material sealing the LED element from above; wherein at least two through-holes electrically connected to the LED element are formed at the outer periphery of the protruding portion and at least two connection electrodes for external electrical connection which are connected respectively to the through-holes are provided on at least one of the upper and lower surfaces adjacent to the through-holes.

The base having high thermal conductivity is made from metals such as copper and aluminum, metal alloys such as copper alloy and aluminum alloy, or aluminum-based ceramics.

Since the LED according to this invention has the LED element mounted directly on a highly thermally conductive heat dissipating base, heat generated in the LED element can be released outside efficiently, allowing bright light to be produced while at the same time minimizing power consumption.

Further, since the LED element is mounted so as not to be in direct contact with the printed circuit board, the heat generated by the LED element(s) is not conveyed to the printed circuit board. This eliminates the need to consider the effect of the heat generated in the LED element, when the LED is used in an electronic device and the LED's printed circuit board is mounted on a printed circuit board of the electronic device. To make a distinction between the printed circuit board comprised in the LED of this invention and the printed circuit board of the electronic device, the latter is referred to as a motherboard.

Further, with the connection electrodes provided on both the upper and lower surfaces adjacent to the through-holes which are formed in the protruding-portion of the printed circuit board, the LED can be mounted on a motherboard by using either of the upper and lower surfaces of the LED printed circuit board.

DETAILED DESCRIPTION OF THE PREFERRED EMBODIMENTS

Now, the preferred embodiments of this invention will be described in detail with reference to the accompanying drawings.

Figure 1:
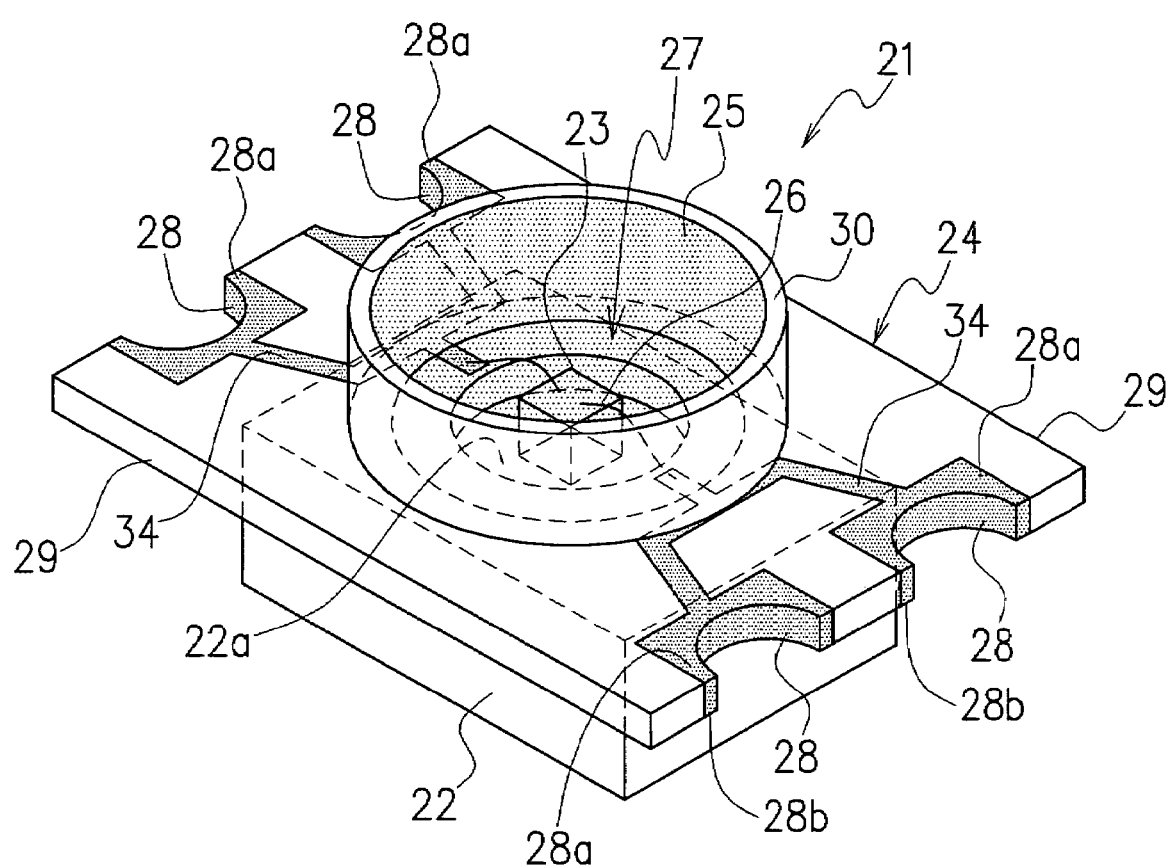
FIG. 1 is a perspective view of an LED as a first embodiment of this invention.
Figure 2:
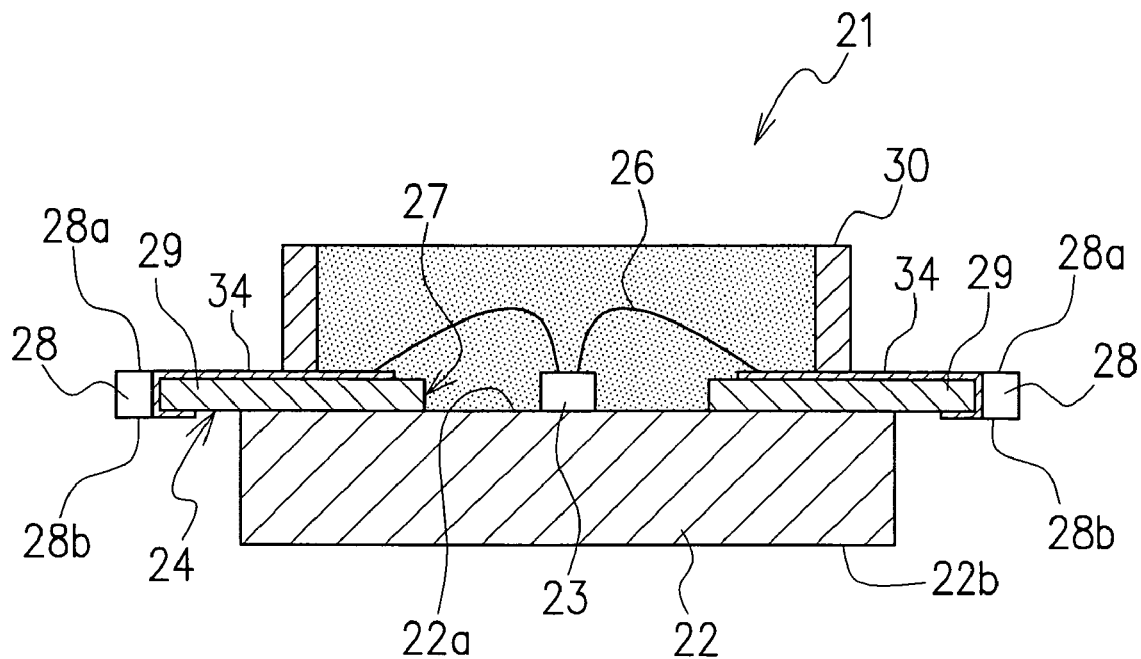
FIG. 2 is a vertical cross-sectional view of the LED shown in FIG. 1.

FIG. 1 and FIG. 2 show an LED as a first embodiment of the invention. This LED 21 comprises a base 22 having high thermal conductivity; at least one LED element 23 fixed at an almost central part of the base 22; an LED printed circuit board 24 mounted on the upper surface of the base 22 to surround the LED element 23; and a light-transmitting resin material 25 sealing the LED element 23.

The base 22 is formed from a material with high thermal conductivity, such as metal materials including copper, copper alloy, aluminum and aluminum alloy, to enhance the heat dissipating effect. The base 22 provides a surface 22a on which the LED element 23 is to be die-bonded. The underside of the base 22 forms a heat dissipating surface 22b that releases heat by making contact with, for instance, a frame of another electronic device wherein the LED is used. For an increased heat dissipating effect, it is preferable that the heat dissipating surface 22b be widened. It is therefore effective to form the base 22 in such a way that its surface area and thickness be as large as possible. The base 22 is not limited to a rectangular column shape and may be formed in a disk shape, a truncated pyramid shape, or a truncated cone shape.

The LED element 23 here has its upper surface and side surfaces as light emitting surfaces and also has a pair of element electrode portions on its upper surface. The LED element 23 is die-bonded at its underside, by means of a bonding agent or the like, to the almost central part of the mounting surface 22a of the base 22, with the element electrode portions connected to the LED printed circuit board 24 described later through bonding wires 26.

The printed circuit board 24 is formed from an insulating material such as glass epoxy resin or BT (bismaleimide triazine) resin. The printed circuit board 24 has a hole 27 at its central portion to expose the LED element 23 which is mounted on the base 22. At least one pair of electrode patterns 34 are provided on a surface of the circuit board, and the element electrode portions of the LED are connected to the electrode patterns through bonding wires 26, respectively. The printed circuit board 24 has a protruding portion 29 extending horizontally and outward on the periphery of the base 22. At least one pair of through-holes 28 is formed at both of the two facing ends of the protruding portion 29 such as the left and the right ends thereof. The electrode patterns 34 are connected to the through-holes 28 respectively. External connection electrodes 28a, 28b that are connected to the through-holes 28 are formed on the upper and lower surfaces of the protruding portion 29 around the through-holes 28.

The resin material 25 sealing the LED element 23 is made of transparent or translucent resin material; a seal frame 30 provided on the printed circuit board 24, is filled with the resin material 25. When a blue LED element is used for the LED element 23, an yttrium-aluminum-garnet (YAG) phosphor may be mixed with the resin material 25 or may be provided on the surface of the resin material to make the LED generate a white light. As described later with reference to FIG. 7, two or more LED elements may be combined. Also, various phosphor materials may be mixed with the resin material 25 or phosphor agents and dyes may be combined. These combinations mentioned above enable manufacture of an LED with desired color rendering properties that can produce light in a wide range of color and brightness, of course including pastel colors. The seal frame 30 is secured by a bonding agent to the upper surface of the printed circuit board 24 so as to enclose the LED element 23. The inner circumferential surface of the seal frame 30 may be given a mirror finish or provided with a light reflecting member such as a metal film, to increase the reflection efficiency of the seal frame 30 and focus light emitted from the LED element 23 in a predetermined direction, for example, by changing the shape of the seal frame 30, thus enhancing the luminance.

Figure 3:
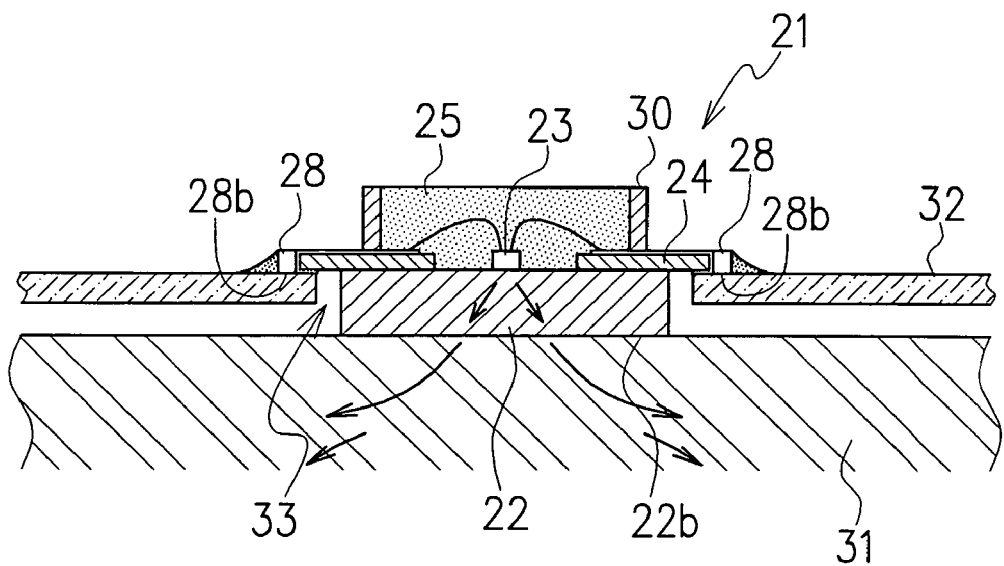
FIG. 3 is a cross-sectional view showing a first example of mounting the LED on a frame of an electronic instrument.
Figure 4:
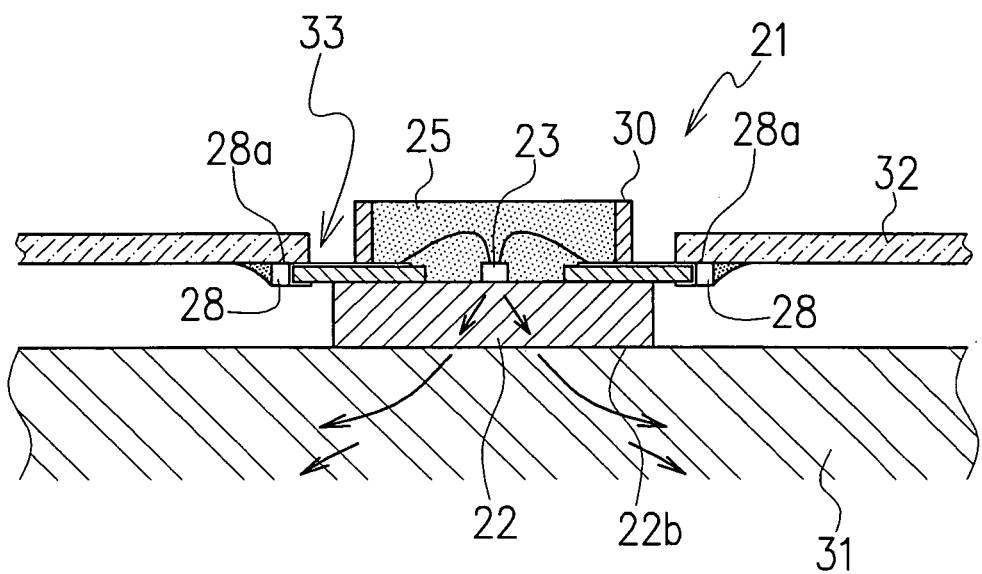
FIG. 4 is a cross-sectional view showing a second example of mounting the LED on a frame of an electronic instrument.

Next is an explanation of how the LED 21 of the above construction is mounted on a printed circuit board installed in a variety of electronic devices. A printed circuit board installed in an electronic device is referred to as a motherboard to distinguish it from the LED printed circuit board. For example, as shown in FIG. 3 and FIG. 4, a motherboard 32 on which the LED 21 is to be mounted is formed with an opening 33, through which the base 22 or the seal frame 30 is inserted. Then, one of the external connection electrodes 28a, 28b on the protruding portion 29 of the LED printed circuit board 24 is soldered to the circumferential edge of the opening 33 for the LED 21 to be secured to the motherboard 32. Since the LED 21 of this embodiment has the LED element 23 directly die-bonded to the base 22, heat generated by the LED element 23 during the light emission operation is dissipated into the air through the base 22. At this time, if the base 22 is placed in contact with a case or frame of an electronic device, heat is released through the case or frame of the electronic device to the outside, enhancing the heat dissipating effect.

The process of mounting the LED 21 is explained in more detail. FIG. 3 shows a first example of the LED to be mounted on a motherboard of an electronic device. The base 22 is inserted into the opening 33 of the motherboard 32 from above. Since the protruding portion 29 of the printed circuit board 24 is larger than the opening 33, the underside of the protruding portion 29 comes into contact with the motherboard 32 at the periphery of the opening 33. This time, the LED is mounted so that the heat dissipating surface 22b of the base 22 is in contact with a surface of a case 31 of the electronic device. The external connection electrodes 28b formed on the underside of the printed circuit board 24 adjacent to the through-holes 28 are then soldered to the upper surface of the motherboard 32 at the periphery of the opening 33.

FIG. 4 shows a second example of the LED mounting process. In this example, the seal frame 30 is inserted into the opening 33 of the motherboard 32 from below, and the upper surface of the protruding portion 29 makes contact with the underside of the motherboard 32 at the periphery of the opening 33 and the heat dissipating surface 22b of the base 22 makes contact with a surface of the case 31 of the electronic device. The external connection electrodes 28a formed on the upper surface of the through-holes 28 are then soldered to the underside of the motherboard 32 at the periphery of the opening 33.

As described above, putting the heat dissipating surface 22b of the base 22 in contact with the case 31 of the electronic device results in an improved heat dissipating effect. Since the LED 21 of this embodiment has the through-holes 28 formed in the protruding portion 29, it can be connected from either its top or bottom side by using the external connection electrodes 28a or 28b provided on the upper and lower surfaces adjacent to the through-holes 28. Thus, as shown in FIG. 3 and FIG. 4, the direction in which the LED 21 is mounted can be chosen according to the position of the motherboard 32 relative to the case 31. If it is known beforehand where the motherboard 32 is to be installed, the thickness of the base 22 can be set according to the position of the motherboard 32, to produce an optimal heat dissipating effect.

While in the above embodiment it has been described how a pair of external connection electrodes 28a, 28b have been provided on both the upper and lower surfaces of the LED circuit substrate adjacent to the through-holes 28, if the direction in which the LED is to be inserted into the opening 33 of the motherboard 32 is known beforehand, the external connection electrodes are needed to be provided on either the upper or the lower surface of the LED circuit substrate, depending on the direction of insertion.

Next, the light emitting and heat dissipating action of the LED 21 will be explained with reference to FIG. 3 and FIG. 4. When a predetermined driving voltage is applied to the LED element 23, the LED element 23 consumes power equal to the product of the applied driving voltage and the driving current, and a part of the consumed power is converted to light emitted outwardly through the resin material 25. The consumed power that was not converted to light is radiated as heat from the entire LED element 23. Here, since the underside of the LED element 23 is in contact with the base 22, the generated heat is first released to the base 22, from which it can be released efficiently through the heat dissipating surface 22b into the case 31. If the case 31, with which the heat dissipating surface 22b is in contact, is made of a metal with high heat conductivity, a more effective heat dissipating action can be produced.

Further, since the printed circuit board 24 is formed with a hole 27 and is not in contact with the LED element 23 as a heat source, it is not directly affected by the heat from the LED element 23. This arrangement prevents the diffusion of heat from the LED printed circuit board 24 into the motherboard 32, effectively minimizing deterioration and breakage of electronic circuits.

Figure 5:
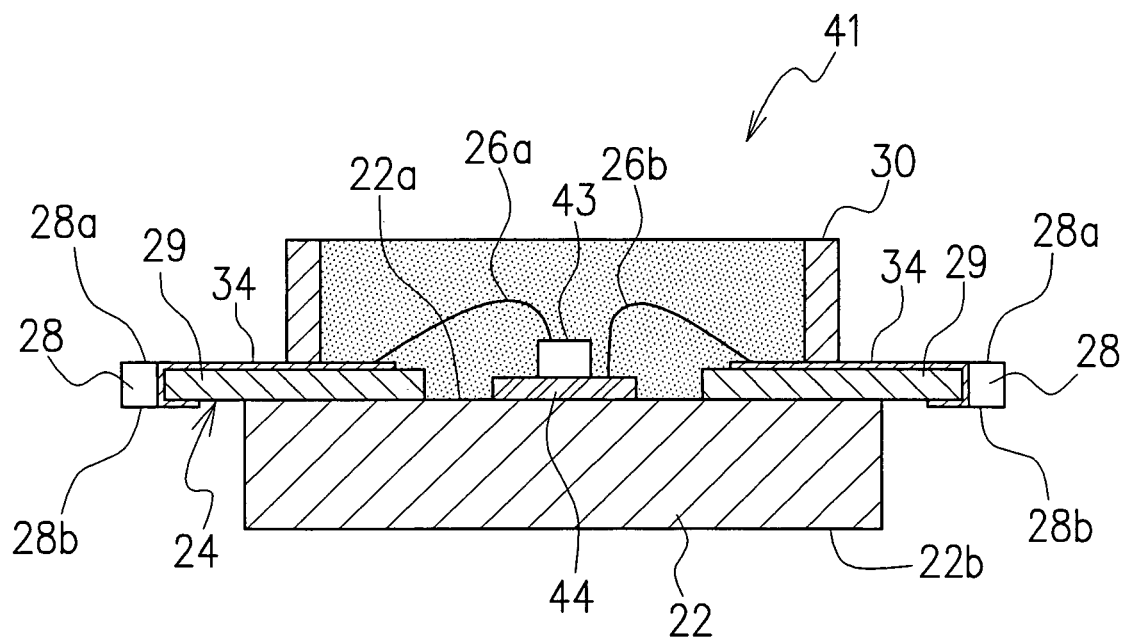
FIG. 5 is a cross-sectional view of an LED as a second embodiment of this invention.

FIG. 5 shows another LED as a second embodiment of this invention. In the LED 41, an LED element 43 has a pair of element electrodes formed on each of the upper and lower surfaces of an LED element 43, respectively. A sub-mount substrate 44 is placed on the mounting surface 22a of the base 22 and the element electrode on the underside of the LED element 43 is die-bonded to the upper surface of this sub-mount substrate 44. A bonding wire 26a is provided to connect the element electrode on the upper surface of the LED element 43 to the electrode patterns formed on the printed circuit board 24. The sub-mount substrate 44 is formed from, for instance, an aluminum-based ceramics or silicon substrate for an enhanced heat dissipation effect. Two patterns are formed on the surface of the sub-mount substrate 44. One is a die bond pattern, on which the element electrode on the underside of the LED element 43 is surface-mounted, and the other is a lead-out pattern extended from the die bond pattern, which is connected through a bonding wire 26b to the other electrode pattern on the printed circuit board 24. In the LED 41 of this construction, heat generated by the LED element 43 is first diffused into the sub-mount substrate 44 and then into the base 22, from which it is further released outside through the heat dissipating surface 22b.

Figure 6:
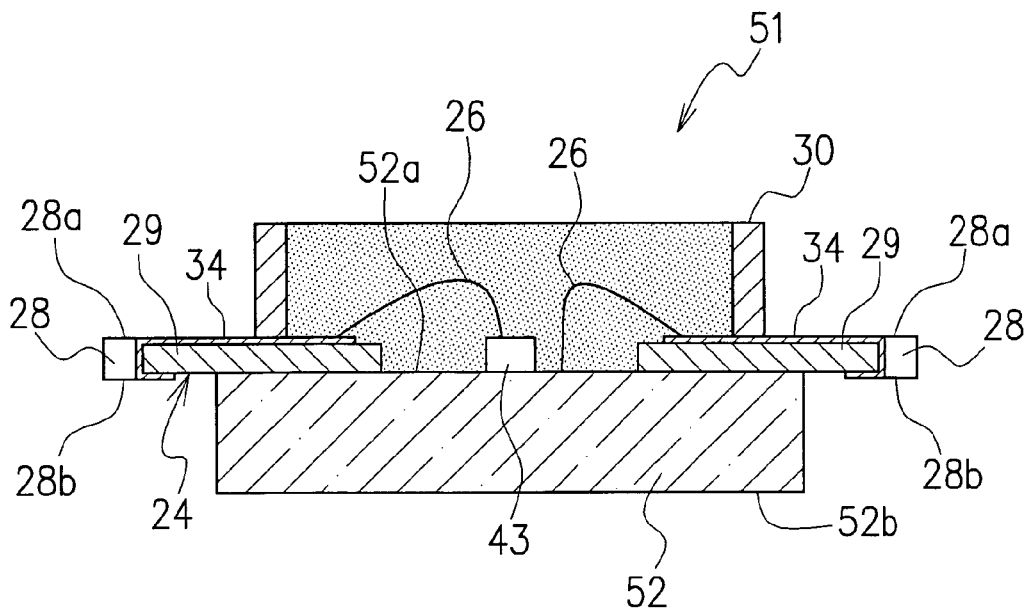
FIG. 6 is a cross-sectional view of an LED as a third embodiment of this invention.

FIG. 6 shows yet another LED as a third embodiment of this invention. The LED 51 is characterized by the fact that a base 52 is formed from a non-metallic material. Preferred non-metallic materials include, for example, aluminum-based ceramics with an insulating property and a high thermal conductivity. The use of such a ceramic material allows an electrode pattern (not shown) to be formed directly on a mounting surface 52a of the base 52 and the LED element 43 to be mounted on the electrode pattern directly, thus enabling omission of the use of the sub-mount substrate 44 shown in the LED 41 of the second embodiment. In this case, since the whole base 52 is formed from ceramics, a sufficient heat dissipating effect can be achieved.

While the LEDs 21, 41, 51 of the above embodiments are constructed using the single LED elements 23, 43, it is possible to mount a plurality of LED elements by increasing the size of the hole 27 in the printed circuit board 24 to provide a larger mounting surface on the bases 22, 52.

Figure 7:
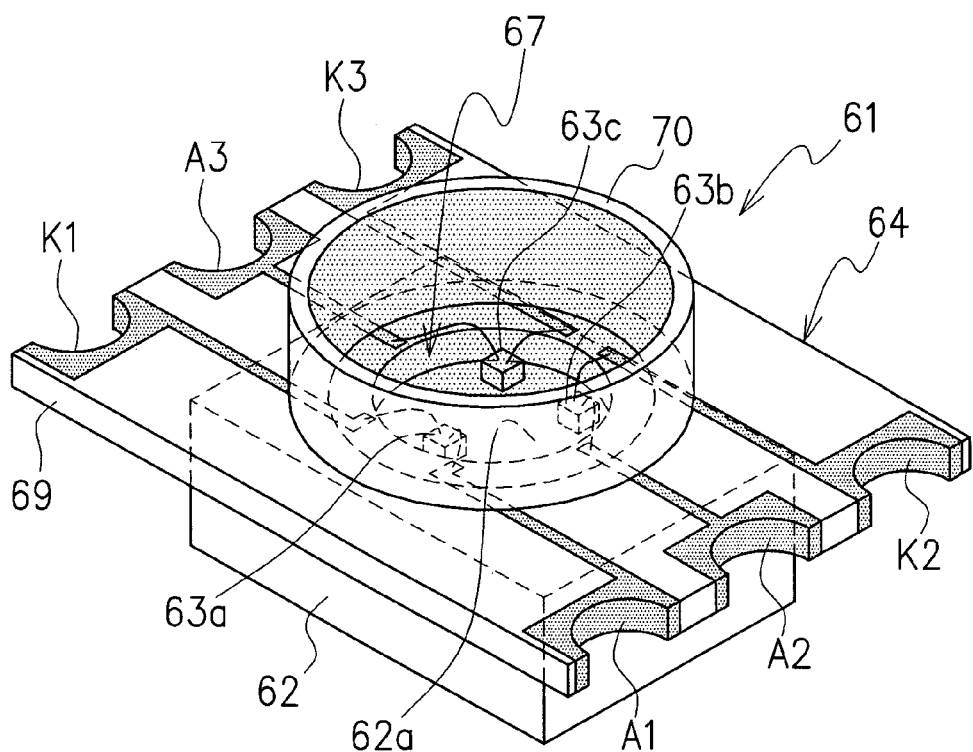
FIG. 7 is a perspective view of an LED as a fourth embodiment of this invention.
Figure 8:
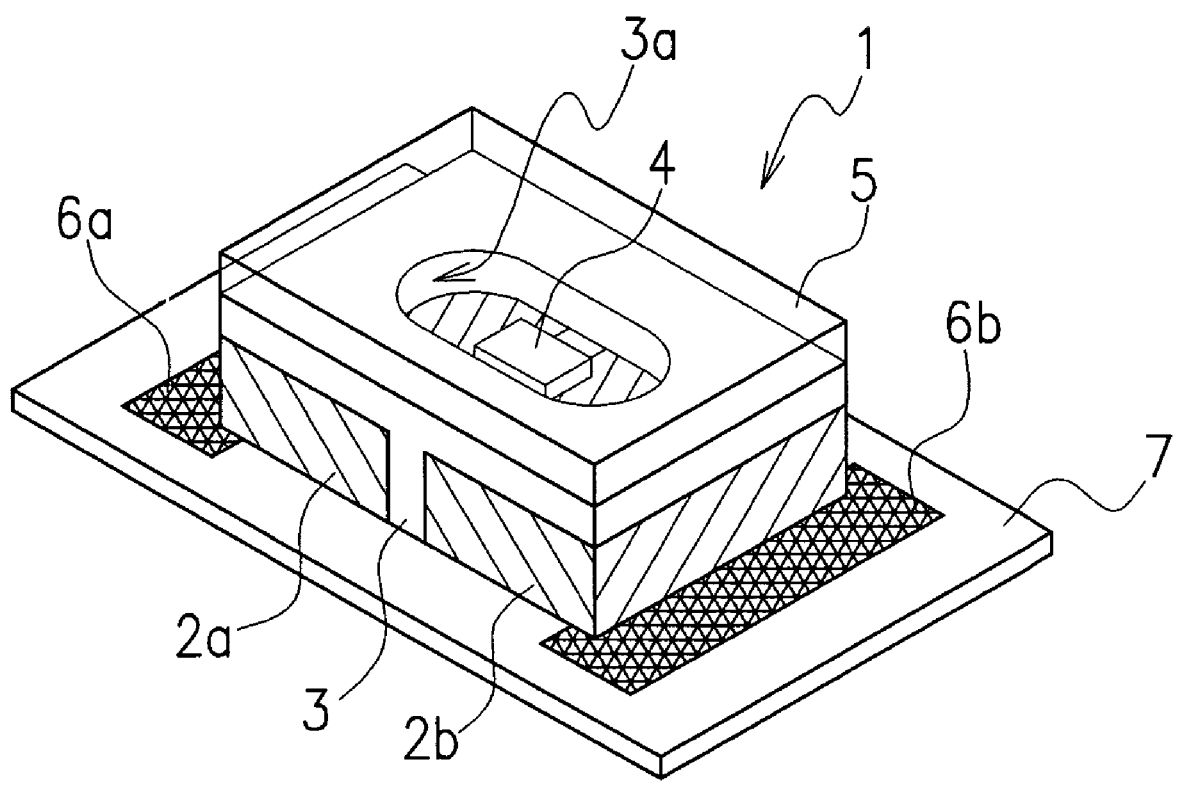
FIG. 8 is a perspective view showing an LED with a conventional heat dissipating function.

FIG. 7 shows yet another LED as a fourth embodiment of this invention. The LED 61 has LED elements 63a, 63b, 63c, which emit three primary colors of light—red, blue and green—respectively, mounted on a mounting surface 62a of a base 62. Through-holes constructed of anode electrodes (A1-A3) and cathode electrodes (K1-K3), that are assigned to these LED elements 63a, 63b, 63c, are formed at the two facing ends such as the left and right ends of the protruding portion 69 of a printed circuit board 64. The printed circuit board 64 has a circular hole 67 which exposes the LED elements 63a, 63b, 63c, and a seal frame 70 is provided to surround the LED elements 63a, 63b, 63c. This LED 61 can be made to emit a variety of colors of light by adjusting the voltage applied to the anode electrodes (A1-A3) and the cathode electrodes (K1-K3). The large amount of heat produced by the plurality of LED elements can be effectively dissipated through the base 62.

What is claimed is:
1. A light-emitting diode with a base comprising:
    a base made of a material having a high thermal conductivity,
the base having an upper surface, a lower surface and a periphery that extends between the upper and lower surfaces;

a printed circuit board mounted on the upper surface of the base, the printed circuit board having an upper surface, a lower surface, a hole passing through the upper and lower surfaces of the printed circuit board, an electrode pattern provided at least on the upper surface of the printed circuit board, a protruding portion horizontally extending from an outer edge of the base, and at least a pair of external connection electrodes provided on at least a part of the protruding portion and electrically connected to the electrode pattern;

at least one light-emitting diode element mounted on the upper surface of the base in the hole of the printed circuit board and electrically connected to the electrode pattern of the printed circuit board; and a resin material sealing the at least one light-emitting diode element.

2. The light-emitting diode with a base according to claim 1, wherein the base is made of one among metal, metal alloy and ceramics.

3. The light-emitting diode with a base according to claim 1, wherein the base is made of one among copper, copper alloy, aluminum, aluminum alloy and aluminum-based ceramics.

4. The light-emitting diode with a base according to claim 1, further comprising a sub-mount substrate provided on the upper surface of the base, wherein the light-emitting diode element is mounted on the sub-mount substrate.

5. The light-emitting diode with a base according to claim 4, wherein the sub-mount substrate is made of one among an aluminum-based ceramics and silicone.

6. The light-emitting diode with a base according to claim 1 further comprising a frame having a light reflecting member on its inner circumferential surface, wherein the frame is arranged around the resin material to surround the light-emitting diode element and the base is larger in size than the frame in top plan view.

7. The light-emitting diode with a base according to claim 1, wherein a plurality of light-emitting diode elements are mounted on the upper surface of the base.

8. The light-emitting diode with a base according to claim 1, wherein:

the protruding portion has through-holes at a side surface of the protruding portion; and each of the external connection electrodes includes electrodes disposed on the upper and lower surfaces of the printed circuit board, and the electrodes are disposed adjacent to and electrically connected to the corresponding through-hole.

9. The light-emitting diode with a base according to claim 1, wherein the resin material extends into the hole provided in the printed circuit board and contacts a portion of the printed circuit board around the hole.

10. An electronic instrument comprising;

a mother board provided with an opening that has a peripheral edge; and the light-emitting diode with a base according to claim 1, mounted on the mother board; and wherein:

the base of said light-emitting diode is inserted in the opening in the mother board; and the external connection electrodes provided in the protruding portion of the printed circuit board are fixed to the peripheral edge of the opening in the mother board by soldering.

* * * * *